(12) United States Patent
Ziglioli

(10) Patent No.: US 10,468,344 B2
(45) Date of Patent: Nov. 5, 2019

(54) METHOD OF MANUFACTURING SEMICONDUCTOR DEVICES AND CORRESPONDING PRODUCT

(71) Applicant: STMICROELECTRONICS S.R.L., Agrate Brianza (IT)

(72) Inventor: Federico Giovanni Ziglioli, Pozzo d'Adda (IT)

(73) Assignee: STMicroelectronics S.r.L., Agrate Brianza (IT)

( * ) Notice: Subject to any disclaimer, the term of this patent is extended or adjusted under 35 U.S.C. 154(b) by 0 days.

(21) Appl. No.: 15/973,049

(22) Filed: May 7, 2018

(65) Prior Publication Data
US 2018/0342453 A1 Nov. 29, 2018

(30) Foreign Application Priority Data

May 23, 2017 (IT) ........................ 102017000055987

(51) Int. Cl.
*H01L 23/498* (2006.01)
*H01L 21/56* (2006.01)
(Continued)

(52) U.S. Cl.
CPC ...... *H01L 23/49861* (2013.01); *H01L 21/486* (2013.01); *H01L 21/565* (2013.01); *H01L 23/3107* (2013.01); *H01L 23/3121* (2013.01); *H01L 23/49827* (2013.01); *H01L 23/49838* (2013.01); *H01L 24/48* (2013.01); *H01L 24/85* (2013.01); *H01L 25/105* (2013.01); *H01L 25/50* (2013.01); *H01L 21/4867* (2013.01); *H01L 2224/48091* (2013.01); *H01L 2224/48101* (2013.01); *H01L 2224/48245* (2013.01)

(58) Field of Classification Search
CPC combination set(s) only.
See application file for complete search history.

(56) References Cited

U.S. PATENT DOCUMENTS

| 4,845,313 A | 7/1989 | Endoh et al. |
| 9,089,053 B2 | 7/2015 | Sawai |

(Continued)

FOREIGN PATENT DOCUMENTS

| JP | S58-191490 A | 11/1983 |
| JP | S59-72757 A | 4/1984 |

(Continued)

OTHER PUBLICATIONS

Friedrich et al., "LDS Manufacturing Technology for Next Generation Radio Frequency Applications," 2016 12th International Congress Molded Interconnect Devices (MID), 6 pages.

*Primary Examiner* — Ratisha Mehta
(74) *Attorney, Agent, or Firm* — Seed Intellectual Property Law Group LLP

(57) ABSTRACT

A method of manufacturing semiconductor products includes: providing a semiconductor product lead frame including a semiconductor die mounting area and an array of electrically conductive leads, molding semiconductor product package molding material, e.g., laser direct structuring material, and forming on the package molding material molded onto the lead frame electrically-conductive lines extending between the semiconductor die mounting area and the array of electrically-conductive leads.

19 Claims, 6 Drawing Sheets

(51) Int. Cl.
*H01L 21/48* (2006.01)
*H01L 23/00* (2006.01)
*H01L 23/31* (2006.01)
*H01L 25/10* (2006.01)
*H01L 25/00* (2006.01)

(56) References Cited

U.S. PATENT DOCUMENTS

| | | |
|---|---|---|
| 2003/0102543 A1 | 6/2003 | Anzai et al. |
| 2008/0054285 A1* | 3/2008 | Park ............... H01L 33/54 |
| | | 257/98 |
| 2010/0019370 A1 | 1/2010 | Pressel et al. |
| 2010/0243844 A1 | 9/2010 | Peloza et al. |
| 2017/0092571 A1* | 3/2017 | Malado ........... H01L 21/32051 |
| 2017/0162530 A1* | 6/2017 | Lin ................. H01L 23/481 |

FOREIGN PATENT DOCUMENTS

| | | | |
|---|---|---|---|
| WO | 2007067982 A2 | 6/2007 | |
| WO | 2010126160 A1 | 11/2010 | |

* cited by examiner

METHOD OF MANUFACTURING SEMICONDUCTOR DEVICES AND CORRESPONDING PRODUCT

BACKGROUND

Technical Field

The description relates to semiconductor devices, such as, e.g., integrated circuits (IC).

Description of the Related Art

Providing wire bonding in semiconductor devices or packages, such as integrated circuits of the QFP (Quad Flat Pack) or the QFN (Quad Flat No-lead) type, may turn out to be a critical issue (e.g., due to lead distance being unfeasible by stamping at lead tip), especially in the presence of a high number of input/output lines.

Wire length being too long for certain wires, wire looping and wire proximity represent possible additional factors to be taken into account.

Advanced QFP technology may resort to hybrid solutions by adopting routing and bonding concepts as derived from BGA (Ball Grid Array) technology. Such arrangements may include passive components, such as capacitors.

Various papers presented at the 12$^{th}$ International Congress On Molded Interconnect Devices (MID) held at Würzburg, Germany on 28-29 Sep. 2016 (see, e.g., A. Friedrich et al.: "LDS manufacturing technology for next generation radio frequency applications") disclose various approaches for the integration of electronic functionalities in EMC-encapsulated semiconductor devices (EMC being an acronym for epoxy molding compound) by adding value, e.g., through increased density at the so-called package level 1.

For instance, the combined use of EMC with LDS technology (LDS being an acronym for laser direct structuring, a technology involving a laser polymer activation, e.g., by using a metallorganic complex as a laser-activatable additive in a polymer matrix) make it possible to integrate electrical circuits directly onto a (cheap) package housing.

This may lead, e.g., to developments, such as antenna-on-package (AoP), package-on-package (PoP), selective or conformal shielding which may result in increased functional density and size and cost reduction as well.

Possible advantages deriving from using an encapsulation, e.g., epoxy molding compound, for encapsulation of semiconductor devices may include:
- protection of the IC package from environmental stress facilitated by the overmolding material,
- (very) high selective metallization and good adhesion strength,
- high temperature resistance and low coefficients of thermal expansion (CTE),
- good radio-frequency (RF) properties and performance at high frequencies,
- feasibility of compression molding and transfer molding,
- possibility of providing LDS/through mold vias.

BRIEF SUMMARY

Despite the intensive activity in that area improved solutions are still desirable both in respect of the manufacturing process and as regards the products obtainable.

One or more embodiments are directed to methods of forming a semiconductor device or package and to a corresponding product. One or more embodiments may be applied to manufacturing semiconductor dice including integrated circuits with a large number of input/output leads and small size. One or more embodiments may involve using various manufacturing technologies such as laser activation compounds, ink printing and electroless plating.

The claims are an integral part of the technical teaching provided herein in respect of the embodiments.

In one or more embodiments, metal traces and bond fingers as in BGA substrates can be provided on a molding compound by laser ablation, plating and/or ink printing performed on a pre-molded lead frame such as QFP/QFN lead frame.

In one or more embodiments, routing may be connected to metal leads, with wire bonding very close to a die.

In one or more embodiments, power bars can be bonded with wire to supply current without giving rise to appreciable power issues.

In one or more embodiments, leads such as power bars may be provided with a certain degree of down setting (or "spanking") thus permitting the molding compound to fill in the corresponding area: this facilitates routing of traces at the same level of the mold body in order to create routing for inner leads.

One or more embodiments may adopt ink printing.

In one or more embodiments, an insulating layer can be applied on top of, e.g., power bars with the conductive layer on top of the insulating layer.

In one or more embodiments a further molding step may be applied to complete the package.

One or more embodiments may take advantage from various established techniques in the art such as those adopted for providing ink printed traces, laser-plated traces and MID metallizations (MID being an acronym for molded interconnect device).

In one or more embodiments, BGA-like traces with a bond finger structure can be created on, e.g., a QFP package thus facilitating the use of a QFP plug-and-play with the semiconductor die already used in BGA technology. This may facilitate assembling more complex devices by keeping the external factor of a QFP or, more generally, a leaded package.

Added value for one or more embodiments may derive from a metallic lead frame with the related advantages in terms of power dissipation, robustness to vibration, suitability for, e.g., automotive products.

BRIEF DESCRIPTION OF THE SEVERAL VIEWS OF THE DRAWINGS

One or more embodiments will now be described, by way of example only, with reference to the annexed figures, wherein.

It will be appreciated that, for the sake of clarity and ease of understanding, the various views may not be drawn to a same scale.

Also, it will be appreciated that features and details exemplified with reference to any one of the figures may be applied, individually or in combination, to embodiments exemplified in any other one of the figures.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Figure 1:
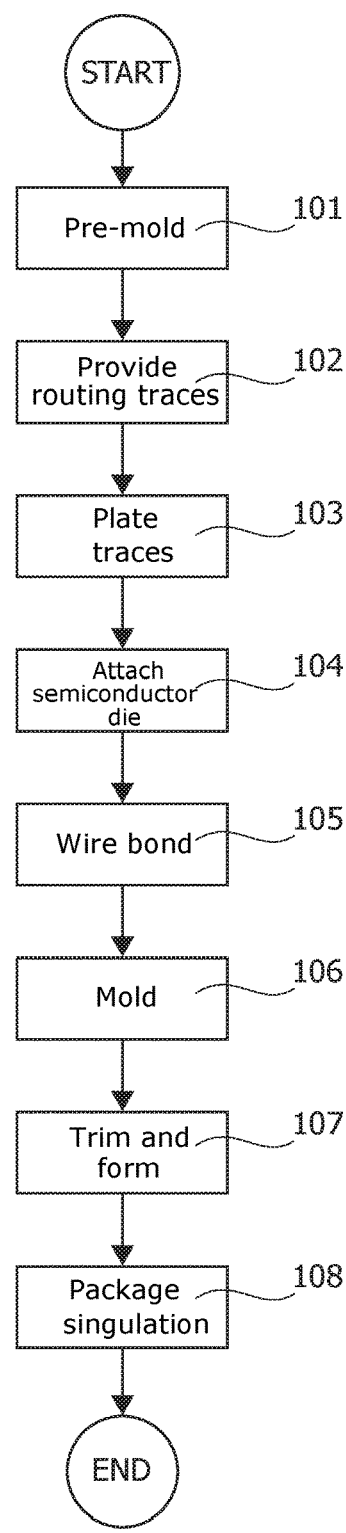
FIG. 1 is a flow chart exemplary of a process for manufacturing semiconductor devices in accordance with one embodiment.

The flow chart of FIG. 1 is exemplary of a possible sequence of a step or acts in an assembly flow which may be adopted in manufacturing semiconductor devices such as integrated circuits (ICs) according to one or more embodiments.

The flow chart of FIG. 1 is intended to facilitate understanding of the ensuing description of various steps/acts in the process. It will otherwise appreciated that, in one or more embodiments, certain ones of the steps/acts exemplified in FIG. 1 may be omitted or replaced by other steps/acts. Similarly in one or more embodiments other steps/acts may be performed in addition to the steps/acts as exemplified.

After a START step, block 101 in FIG. 1 is exemplary of a pre-molding step of a (e.g., metal) lead frame with a molding compound followed by providing routing traces in a step 102.

In one or more embodiments, providing such traces may involve laser ablation of an LDS compound used for pre-molding the lead frame, with block 103 exemplary of plating of the traces formed in a step 102.

As discussed in the foregoing, LDS processing may be replaced at least partly by ink-printing the routing traces on package material (e.g., EMC) pre-molded onto a lead frame.

Block 104 in FIG. 1 is exemplary of an act of attaching one or more semiconductor dice on a die pad in the lead frame, possibly followed by wire bonding as exemplified in block 105.

Block 106 is exemplary of (further) molding which may lead to complete encapsulation of the semiconductor die or chip.

Block 107 is exemplary of trim and form processing (if necessary) followed by package singulation (block 108) to separate individual packages from each other, which may lead to an END step of the process.

In this latter respect it will be noted that, while the figures exemplify—for the sake of simplicity and is understanding—steps/acts performed on individual semiconductor product units, these steps/acts may be actually performed on a "strip" of such units still connected together and eventually intended to be separated by singulation.

Figure 2:
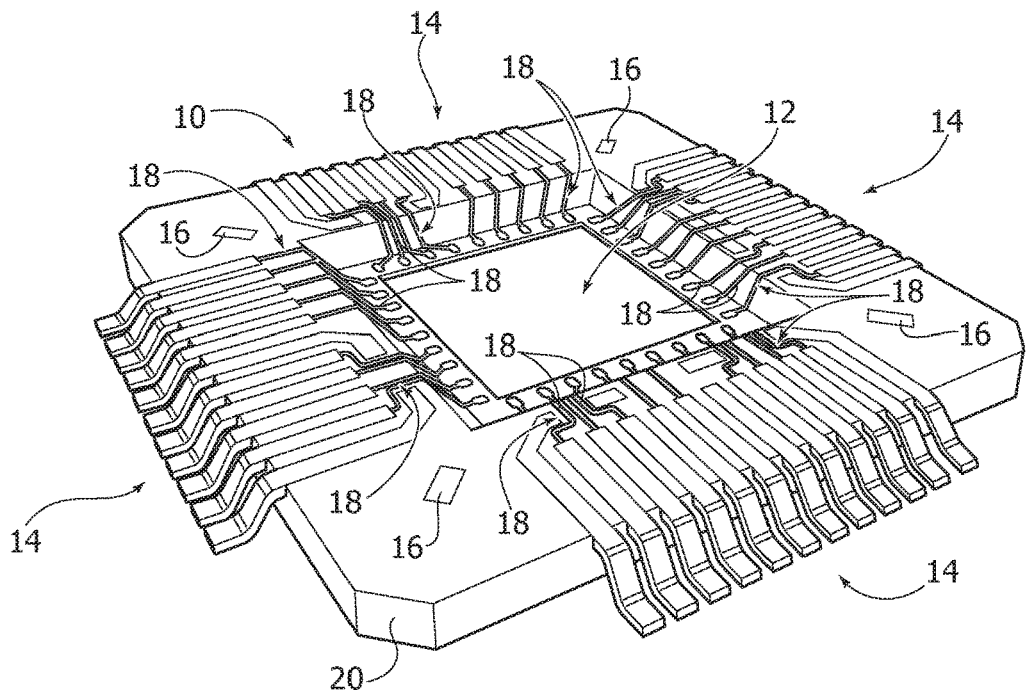
FIG. 2 is a top isometric view of a pre-molded lead frame in accordance with one embodiment.

FIG. 2 is a schematic perspective view of a formed unit according to one or more embodiments including a lead frame 10 pre-molded with a molding compound.

Embodiments as exemplified in FIG. 2 may include a die pad 12 with arrays of leads 14 extending, e.g., at four sides of the lead frame (which may include tie bars, e.g., as shown at 16).

Lead frames 10 as discussed herein are conventional in the art, which makes it unnecessary to provide a more detailed description.

For instance, FIG. 2 is exemplary of pre-molded lead frame that includes a lead frame 10 wherein the die pad 12 is "downset" with respect to the leads 14.

In FIG. 2, reference number 18 indicates a layout of electrically-conductive lines (routing traces) extending between the leads 14 of the lead frame and connection pads which facilitate electrical connection to a semiconductor die or chip to be coupled to the lead frame 10 as discussed below.

Reference number 20 denotes a package molding compound, which, in one or more embodiments, is pre-molded onto the lead frame 10, e.g., prior to attachment of a semiconductor die or chip onto the lead frame (e.g., at die pad 12). The molding compound is any molding compound used in semiconductor packaging and in one embodiment is resin.

In one or more embodiments, the routing traces 18 are formed onto the pre-molded package material as exemplified by the blocks 102 and 103 in the flow chart of FIG. 1 (which precede the block 104 exemplary of die attachment).

Figure 3:
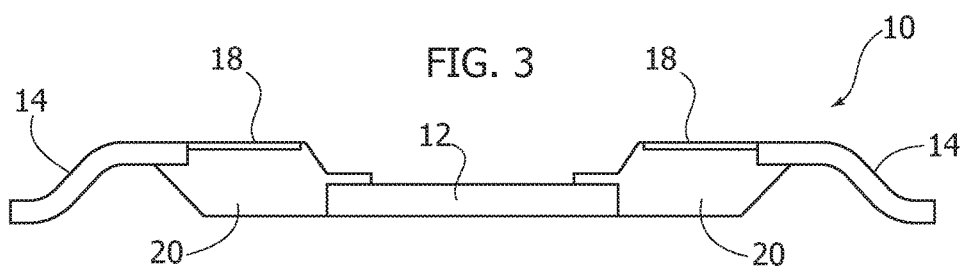
FIG. 3 is a cross-section view of the pre-molded lead frame of FIG. 2, FIGS. 4 and 5 are cross-section views of a pre-molded lead frames according to other embodiments.
Figure 4:
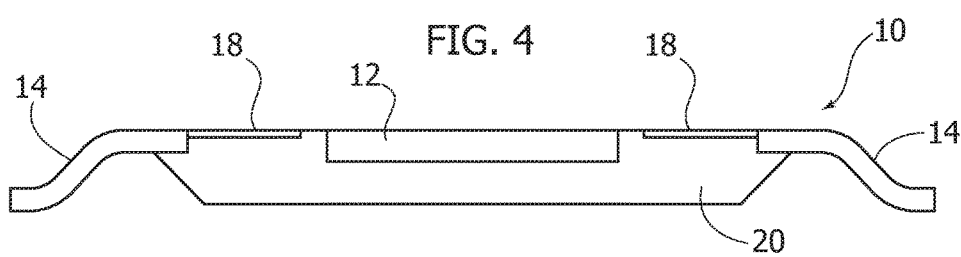
Figure 5:
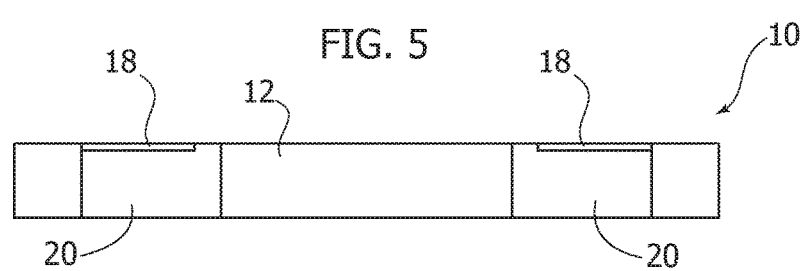

FIGS. 3 and 5 are exemplary of pre-molded lead frames being adapted to be applied to a lead frame 10 of the type with a downset (as exemplified in FIG. 3—and FIG. 2 as well), a lead frame 10 of the "no-downset" type (as exemplified in FIG. 4) or a "leadless" lead frame 10 (as exemplified in FIG. 5).

In one or more embodiments, providing the electrically-conductive routing traces 18 may include (localized) laser activation of the package mold compound by resorting to LDS (laser direct structuring) technology with the package mold material 20 including, e.g., a metallorganic complex as a laser-activatable additive in the polymer matrix.

One or more embodiments may contemplate:
the whole body of the package mold material 20 including LDS material, or only a portion of the package mold material 20, such as a (surface) portion arranged in the vicinity of the leads 14, including LDS material, while the remaining bulk portion includes conventional (non-LDS) package mold material.

Alternatively, providing the electrically-conductive routing traces 18 on the package material 20 may include printing electrically-conductive ink (e.g., silver-based ink) onto, e.g., EMC material pre-molded onto the lead frame 10.

Figure 6:
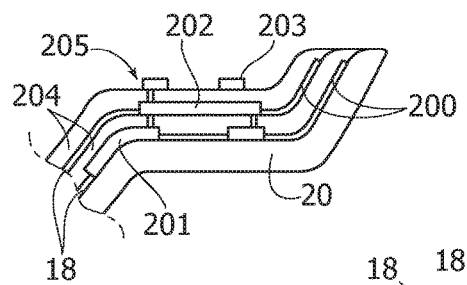
FIG. 6 is an exploded cross-section view of a portion of a pre-molded lead frame in accordance with one embodiment.

While represented in FIGS. 2 to 5 as including simple lasering/printing steps, in one or more embodiments providing the routing traces 18 may include resorting to more complex arrangements as exemplified in FIG. 6.

In FIG. 6, an arrangement is exemplified applied to a circuit carrier 20 (e.g., a 3D-MID circuit carrier) involving various techniques such as:
  plural laser activated surfaces (e.g., 200),
  plural metallization layers (e.g., 201, 202, 203),
  overmolded dielectric layers (e.g., 204),
  laser-drilled vias (e.g., 205).

These techniques are per se known in the art, thus making it unnecessary to provide a more detailed description herein.

FIGS. 7 to 16 (wherein parts/elements like parts/elements already discussed in the foregoing are indicated with like reference numerals without repeating a corresponding description for the sake of brevity) are exemplary of various developments/variants of the basic concept outlined in FIGS. 2 to 5.

Figure 7:
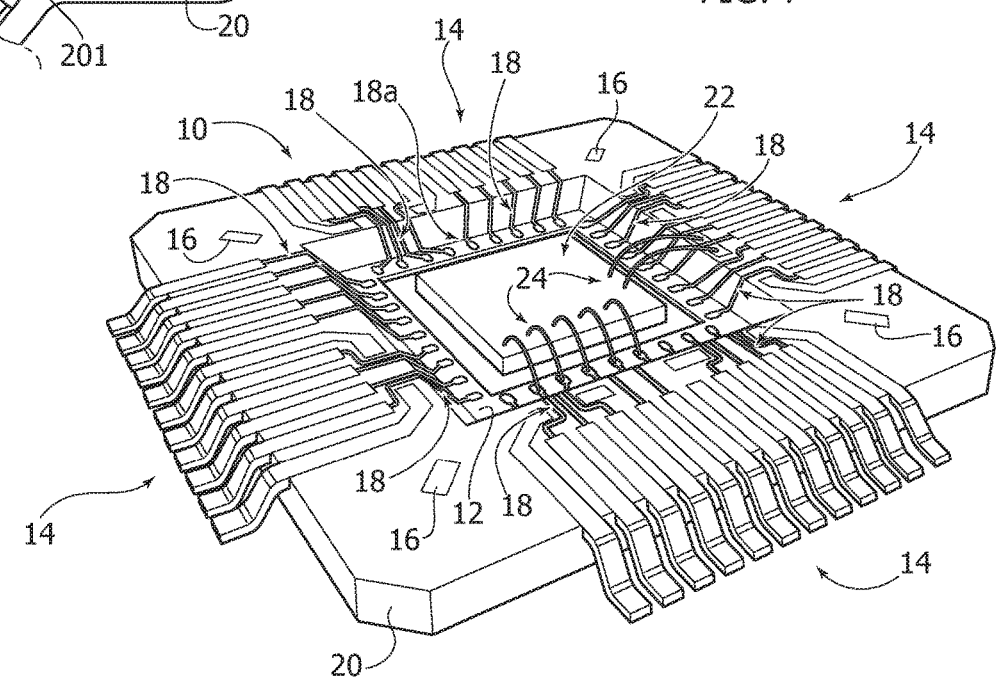
FIGS. 7 and 8 are top isometric views of semiconductor packages at a stage in the manufacturing process in accordance with other embodiment, the semiconductor packages including the pre-molded lead frame of FIG. 2.

In particular, FIG. 7 is exemplary of a semiconductor package including a semiconductor die or chip 22 attached to the die pad 12 (e.g., block 104 in FIG. 1) of the pre-molded lead frame of FIG. 2, while a wire bonding layout 24 (e.g., block 105 in FIG. 1) may be provided between contact die pads at the upper or top surface of the chip or die 22 and bond fingers 18a provided at the "proximal" (that is, inner) ends of traces 18 in the routing layout. The semiconductor die or chip 22 includes an active surface having one or more electrical components, such as integrated circuits as is known in the art.

Figure 8:
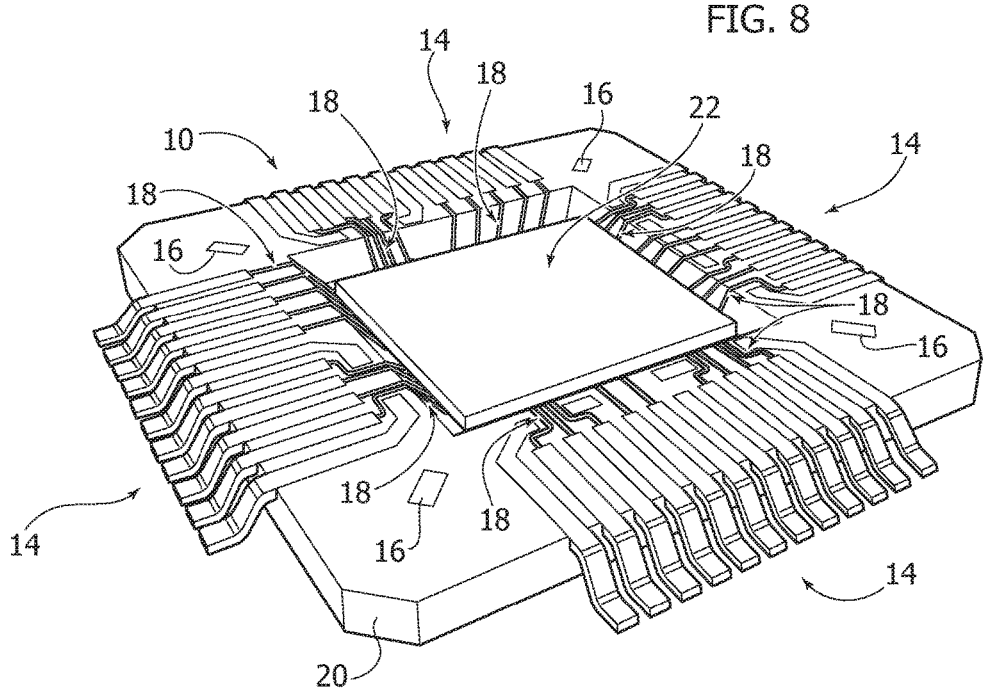

FIG. 8 is exemplary of semiconductor package with the die or chip 22 attached to the die pad 12 of the pre-molded lead frame of FIG. 2 by flip-chip mounting, with electrical contact pads at the "top" surface of the chip or die 22 (facing downwards and thus not visible in FIG. 8) coupled in electrical contact with the proximal ends of routing traces 18.

Figure 9:
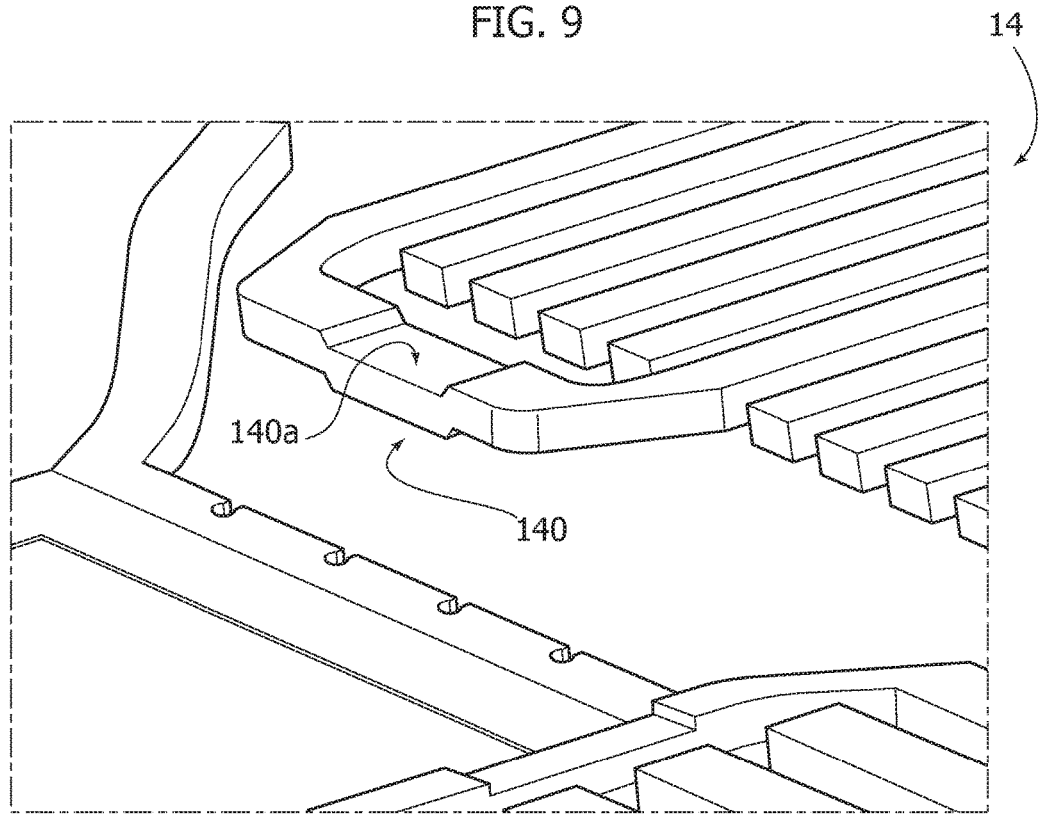
FIG. 9 is an exploded top isometric view of a portion of the lead frame prior to being pre-molded.
Figure 10:
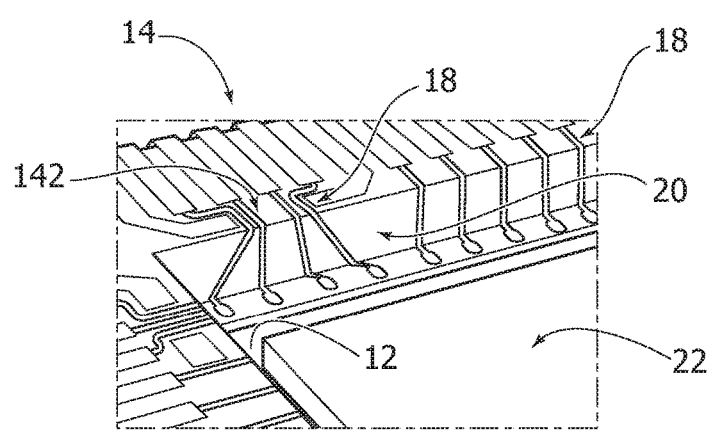
FIG. 10 is top isometric view of a portion of the lead frame of FIG. 9 after being pre-molded.

FIGS. 9 and 10 are exemplary of the possibility of providing certain ones of the leads 14 (e.g., power bars) with downset portions as exemplified at 140 in FIG. 9, which shows a recessed portion 140a. In that way the (pre-molded) molding compound 20 may fill the recessed portion 140a of the downset and facilitate providing routing traces 18 (as discussed previously) extending—as indicated at 142 in FIG. 10—over the package material, with that material providing electrical insulation with respect to the downset portion 140 of the power bar.

While exemplified in connection with power bars, such a downset arrangement may be adopted more generally for other leads 14 so that electrically conductive traces can be provided extending over the insulating (e.g., resin) material filling the recessed portion of the downset.

Figure 11:
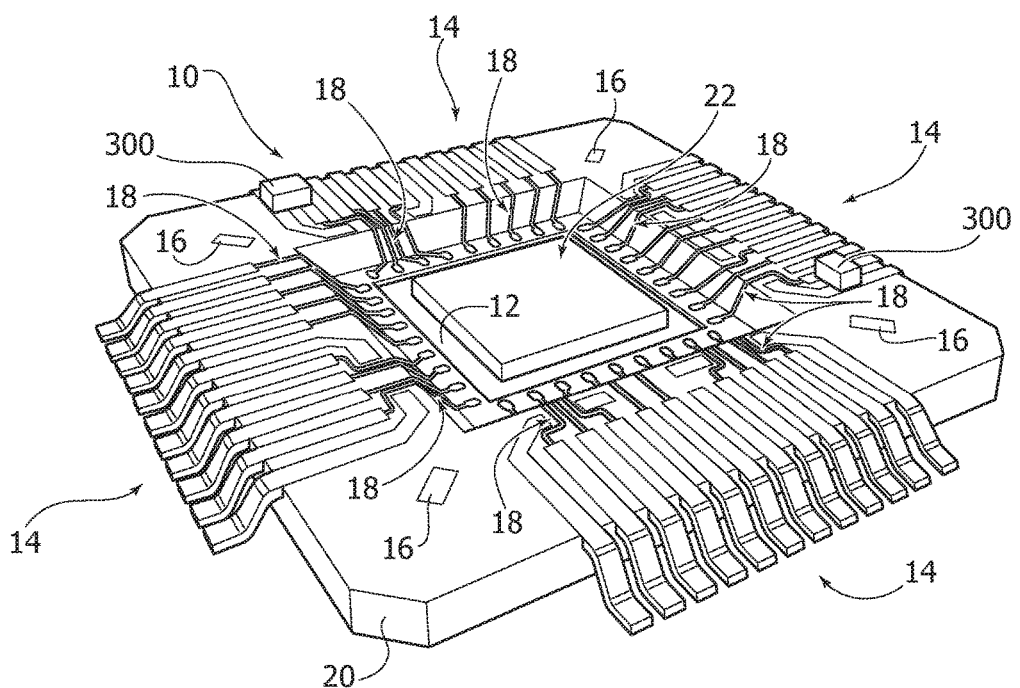
FIG. 11 is a top isometric view of a semiconductor package including a pre-molded frame at a stage in the manufacturing process in accordance with other embodiment.
Figure 12:
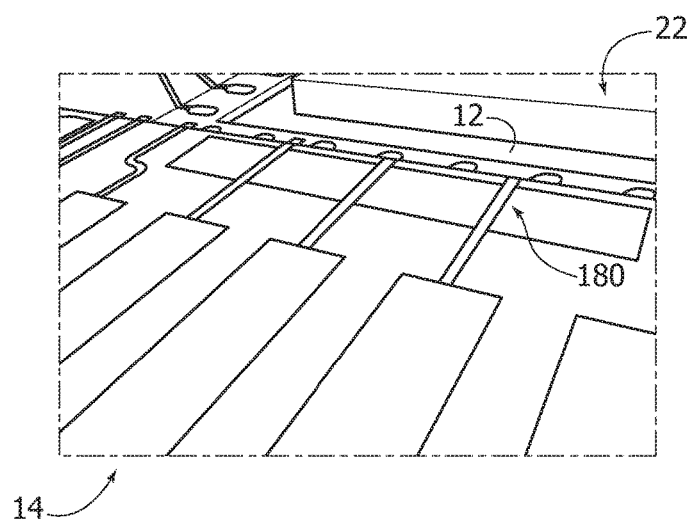
FIG. 12 is an exploded view of the semiconductor package of FIG. 11 without a passive component 300 mounted thereon, in accordance with another embodiment.

FIGS. 11 and 12 are exemplary of the possibility of providing components, such as passive components (e.g., capacitors, resistors) 300, arranged, e.g., bridge-like between leads 14 such as supply (VDD) and ground (GND) leads.

As exemplified in FIG. 12 insulator material 180 can be provided to facilitate mounting such passive components even across plural leads while facilitating electrical insulation with respect to the "bridging" component (passive component).

Figure 13:
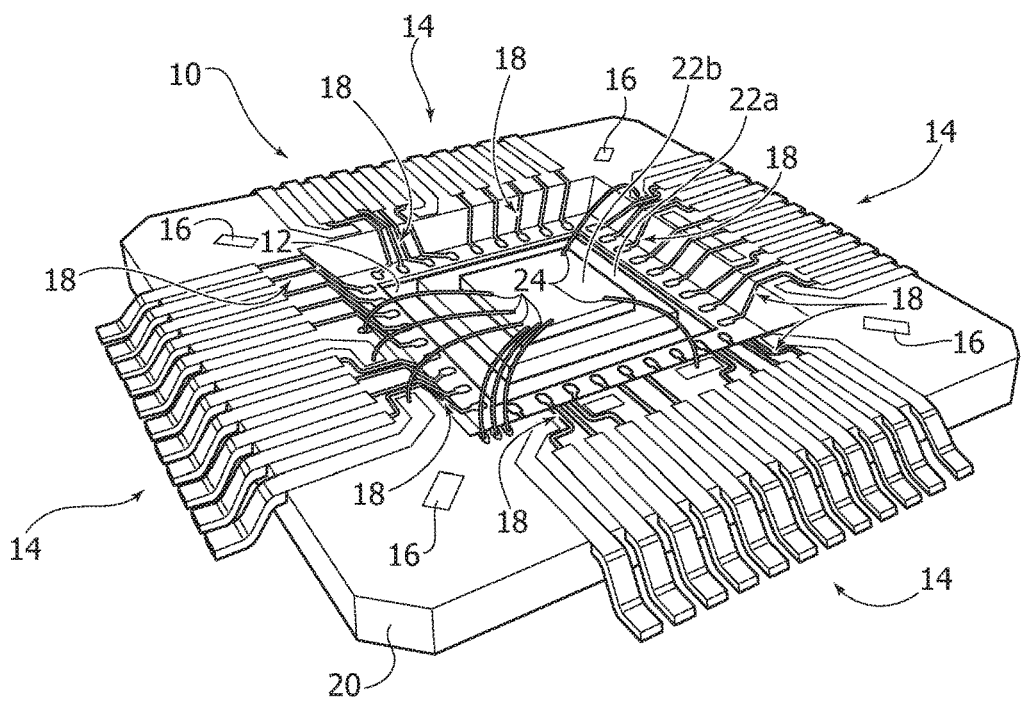
FIG. 13 is a top isometric view of a semiconductor package including a pre-molded lead frame at a stage in the manufacturing process in accordance with another embodiment.

FIG. 13 is exemplary of the possibility of arranging, e.g., in a downset portion of the lead frame 10, a plurality of dice or chips 22a, 22b, e.g., in a stacked arrangement (side-by-side arrangement may be likewise contemplated), e.g., with a wire bonding layout 24 serving one of the chips or dice (e.g., an upper one in the stack such as 22b) while another chip or die (e.g., the lower one in the stack such as 22a) may be coupled to the routing traces 14 by flip-chip coupling, e.g., as discussed in connection with FIG. 8.

Figure 14:
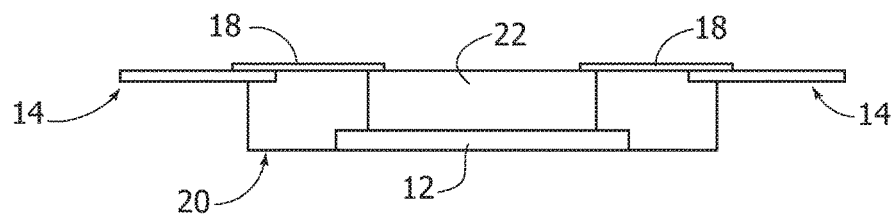
FIGS. 14 to 16 are cross-section view of semiconductor packages including a pre-molded lead frame in accordance with various embodiments.
Figure 15:
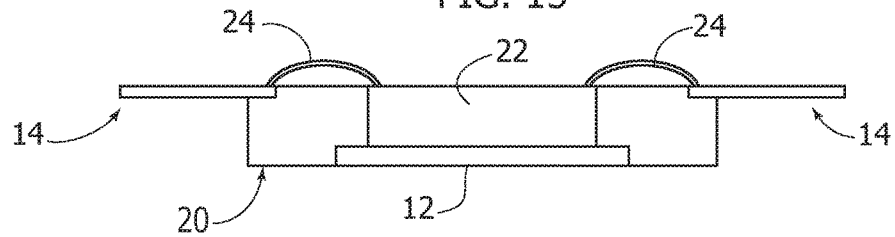
Figure 16:
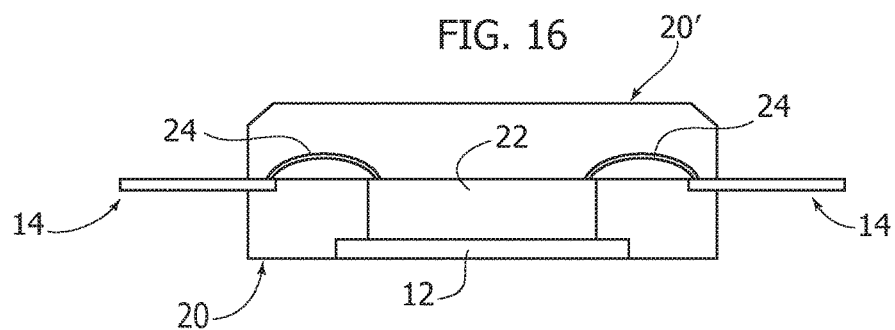

FIGS. 14 to 16 are exemplary of further possible variants in one or more embodiments.

It will be again noted that features exemplified in connection with embodiments exemplified in any one of the figures can be applied, individually or in combination, also to embodiments exemplified in any other of the figures.

For instance, as exemplified in FIG. 14, one or more embodiments may contemplate leaving the die or chip 22 exposed while the lead frame 10 (with the die or chip already 22 attached thereon) is molded on the lead frame 10, with electrical connections between die pads and leads provided after partial molding has left the die 22 at least partially exposed.

In one or more embodiments as exemplified, e.g., in FIG. 15 wire bonding as shown at 24 may be used for power supply to the die 22 while signals run on routing traces 18 provided on the package material.

Finally, FIG. 16 is exemplary of the possible completion of the package via a further molding step (as exemplified at 20'—see also block 106 in FIG. 1) so that the die 22 is completely encapsulated by package material.

A method according to one or more embodiments may include:
  providing a semiconductor product lead frame (e.g., 10) including a semiconductor die mounting area (e.g., die pad 12) and an array of electrically conductive leads (e.g., 14),
  molding (e.g., 101) semiconductor product package molding material (e.g., 20) onto the lead frame, and
  forming (e.g., 102, 103) on the package molding material molded onto the lead frame electrically-conductive lines (e.g., 18) extending between the semiconductor die mounting area and the array of electrically-conductive leads.

One or more embodiments may include molding laser-activatable package molding material onto the lead frame (optionally only in the vicinity of the leads), wherein forming the electrically-conductive lines may include laser treatment (e.g., laser ablation—102) of the laser-activatable package molding material molded onto the lead frame.

One or more embodiments may include ink-printing electrically-conductive lines onto the molding package material molded onto the lead frame.

In one or more embodiments, forming the electrically-conductive lines may include at least one of:
  molding laser-activatable package molding material onto the lead frame (10) and plurally applying (see, e.g., 200 in FIG. 6) laser treatment to the package molding material molded onto the lead frame (10), and/or
  providing at least one electrically-conductive metallization layer (e.g., 201, 202, 203) on the package molding material molded onto the lead frame (10), and/or overmolding at least one dielectric layer (e.g., 204) onto the electrically-conductive lines, and/or forming electrically-conductive vias (e.g., 205) through the package molding material molded onto the lead frame.

One or more embodiments may include providing the semiconductor die mounting area as a downset portion of the lead frame.

One or more embodiments may include:

providing at least one downset portion (e.g., 140 in FIG. 9) in at least one of the leads in the lead frame, molding (e.g., 140a) the package molding material onto the downset portion, and forming at least one electrically-conductive line (e.g., 18, 142 in FIG. 10) over the package molding material filling the downset portion.

One or more embodiments may include arranging at least one electrical component (e.g., 300 in FIG. 11) bridge-like between leads (e.g., power bars) in the array of electrically-conductive leads, optionally by providing insulating material (e.g., 180 in FIG. 12) over leads (14) bridged over by the at least one electrical component.

One or more embodiments may include at least one of:

mounting at least one semiconductor die (e.g., 22; 22a, 22b) at the semiconductor die mounting area (die pad) of the lead frame and providing wire bonding (e.g., 24) between the at least one semiconductor die and the array of electrically-conductive leads, and/or mounting at least one semiconductor die at the semiconductor die mounting area (die pad) of the lead frame by flip-chip mounting onto the proximal ends of electrically-conductive lines formed on the package-molding material, and/or mounting plural semiconductor dice (e.g., 22a, 22b) at the semiconductor die mounting area (die pad) of the lead frame.

One or more embodiments may include molding (e.g., 106) further package molding material (e.g., 20') onto the lead frame having at least one semiconductor chip attached at the semiconductor die mounting area.

In one or more embodiments a product may include:

a semiconductor product lead frame including a semiconductor die mounting area (die pad) and an array of electrically conductive leads, semiconductor product package molding material molded onto the lead frame, and electrically-conductive lines extending between the semiconductor die mounting area and the array of electrically-conductive leads, the electrically-conductive lines formed on the package molding material molded onto the lead frame.

Without prejudice to the underlying principles, the details and embodiments may vary, even significantly, with respect to what has been described by way of example only, without departing from the extent of protection.

The various embodiments described above can be combined to provide further embodiments. These and other changes can be made to the embodiments in light of the above-detailed description. In general, in the following claims, the terms used should be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:

molding a laser direct structuring (LDS) package molding material on a portion of a lead frame, the lead frame including a die pad and an array of electrically-conductive leads; and forming electrically-conductive lines on the LDS package molding material, wherein forming the electrically-conductive lines includes laser activating the LDS package molding material, the electrically-conductive lines extending between the die pad and the array of electrically-conductive leads, the electrically conductive lines being coupled to the electrically-conductive leads.

2. The method of claim 1, wherein forming the electrically-conductive lines includes at least one of:

forming at least one electrically-conductive metallization layer on the LDS package molding material;

overmolding at least one dielectric layer onto the electrically-conductive lines; and forming electrically-conductive vias through the LDS package molding material molded onto the lead frame.

3. The method of claim 1, wherein the die pad is recessed below a surface of the array of electrically-conductive leads.

4. The method of claim 1, further comprising:

providing at least one downset portion in at least one of the leads in the lead frame, molding the LDS package molding material onto the downset portion, and forming at least one electrically-conductive line over the LDS package molding material filling the downset portion.

5. The method of claim 1, further comprising arranging at least one electrical component bridge-like between leads in the array of electrically-conductive leads by providing insulating material over leads bridged over by the at least one electrical component.

6. The method of claim 1, further comprising:

mounting at least one semiconductor die to the die pad of the lead frame and coupling conductive wires between the at least one semiconductor die and the array of electrically-conductive leads, respectively; or mounting at least one semiconductor die to the die pad of the lead frame by flip-chip mounting onto proximal ends of electrically-conductive lines formed on the LDS package molding material.

7. The method of claim 1, further comprising;

attaching a semiconductor die to the die pad; and molding a package molding material.

8. The method of claim 1, further comprising mounting a plurality of semiconductor dice at the die pad of the lead frame.

9. The method of claim 1 further comprising:

plating routing traces on the electrically-conductive lines.

10. A device, comprising:

a lead frame including a die pad and an array of electrically conductive leads;

an LDS package molding material molded to the lead frame, the LDS package molding material forming a first surface and having laser activated conductive lines; and electrically-conductive routing traces on the laser activated conductive lines of the first surface of the LDS package molding material and extending between the die pad and the array of electrically-conductive leads.

11. The device of claim 10, further comprising a semiconductor die coupled to the die pad.

12. The device of claim 11, further comprising a package molding material covering the semiconductor die and the electrically-conductive lines.

13. The device of claim 12 wherein the package molding material is same material as the LDS package molding material.

14. The device of claim 12 wherein a back surface of the die pad is exposed from the LDS package molding material.

15. A semiconductor package, comprising:
a lead frame including a die pad and conductive leads;
an LDS package molding material molded to the lead frame and coupling the die pad to the conductive leads, the LDS package molding material forming a first surface and having laser activated conductive lines;
conductive routing traces on the laser activated conductive lines of the first surface of the LDS package molding material, the conductive routing traces coupled to the conductive leads, respectively; and
a first semiconductor die coupled to the die pad.

16. The device of claim 15, further comprising a package molding material covering the first semiconductor die and the conductive lines, the package molding material having a surface facing the first surface of the LDS package molding material.

17. The device of claim 16, further comprising conductive wires having first ends coupled to the first semiconductor die and second ends coupled to the conductive leads.

18. The semiconductor package of claim 15, comprising a second semiconductor die stacked on the first semiconductor die.

19. The semiconductor package of claim 15 wherein a portion of the conductive routing traces are embedded in the LDS package molding material.

* * * * *